United States Patent
Hussain et al.

(10) Patent No.: US 6,680,236 B2
(45) Date of Patent: Jan. 20, 2004

(54) ION-IMPLANTATION AND SHALLOW ETCHING TO PRODUCE EFFECTIVE EDGE TERMINATION IN HIGH-VOLTAGE HETEROJUNCTION BIPOLAR TRANSISTORS

(75) Inventors: Tahir Hussain, Calabasas, CA (US); Mary C. Montes, West Hills, CA (US)

(73) Assignee: Raytheon Company, Lexington, MA (US)

( * ) Notice: Subject to any disclaimer, the term of this patent is extended or adjusted under 35 U.S.C. 154(b) by 100 days.

(21) Appl. No.: 10/044,689

(22) Filed: Jan. 11, 2002

(65) Prior Publication Data

US 2003/0134482 A1 Jul. 17, 2003

(51) Int. Cl.$^7$ ............................................. H01L 21/331
(52) U.S. Cl. ....................................... 438/343; 257/571
(58) Field of Search ................................ 438/309, 312, 438/343; 257/197, 370, 586

(56) References Cited

U.S. PATENT DOCUMENTS 4,599,118 A * 7/1986 Han et al. .................... 438/291
5,028,549 A    7/1991 Chang et al.

OTHER PUBLICATIONS

F. Ren et al., "Implant isolation of GaAs–AlGaAs heterojunction bipolar transistor structures", Applied Physics Letters, vol. 56, No. 9, pp. 860–862 (Feb. 26, 1990).

Appl. Phys. Letters 56 (9), Feb. 26, 1990, "Implant Isolation of GaAs–AlGaAs Heterojunction Bipolar Transistor Structures".

* cited by examiner

Primary Examiner—David Nelms
Assistant Examiner—David Vu
(74) Attorney, Agent, or Firm—Leonard A. Alkov; Glenn H. Lenzen, Jr.

(57) ABSTRACT

A method is provided for improving edge terminations in a semiconductor device while maintaining breakdown voltage of said semiconductor device at or near its theoretical limit. The method comprises: employing ion-implantation to create a compensated region around the semiconductor device, followed by wet chemical etching to form a mesa on the order of 0.2 to 0.3 μm. The method provides a simple but novel approach to fabricate edge terminations in semiconductor devices in general and in devices employing p-n junctions such as in a GaAs heterojunction bipolar transistor (HBT) to achieve near-ideal electrical characteristics at the device edge. Instead of traditional edge beveling techniques such as those involving grinding, sandblasting, or mesa-etching using masks, the technique disclosed herein utilizes ion-implantation to create a compensated region around the device and wet chemical etching to make a shallow mesa.

7 Claims, 3 Drawing Sheets

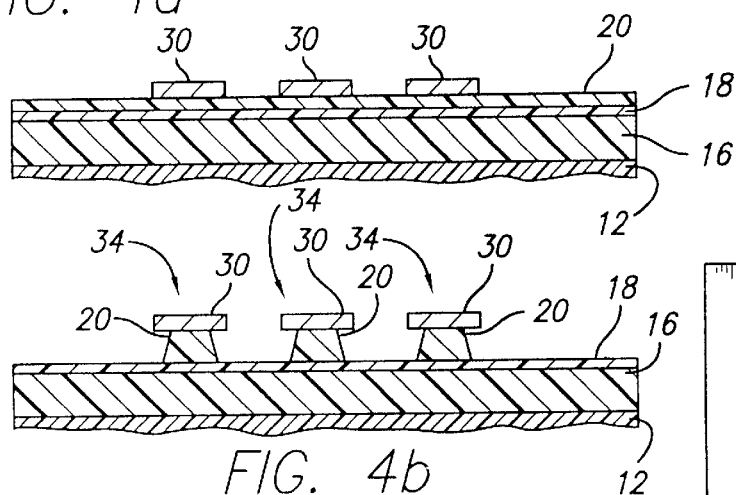
FIG. 4a
FIG. 4b
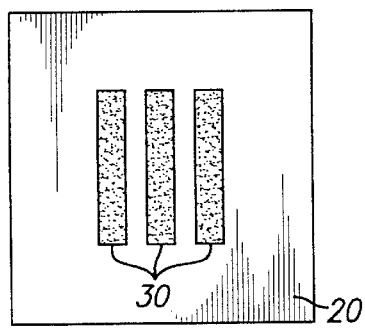
FIG. 5a
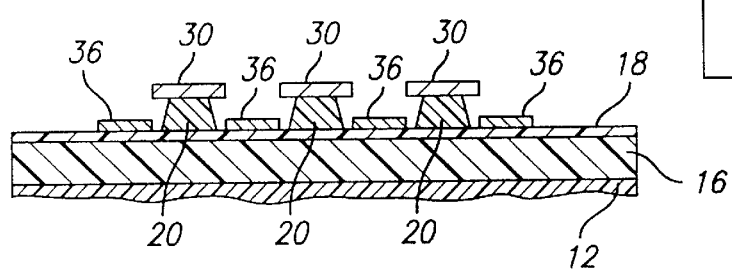
FIG. 4c
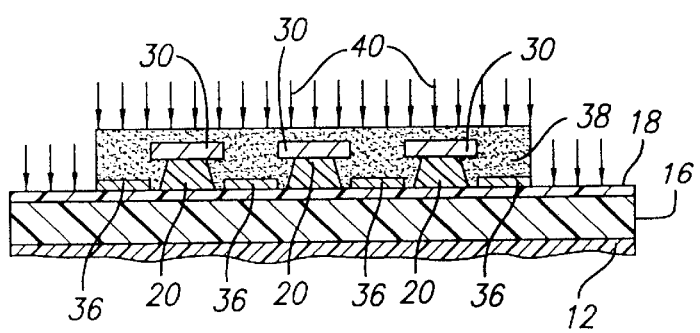
FIG. 4d
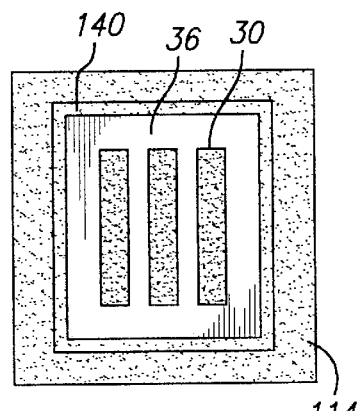
FIG. 5b
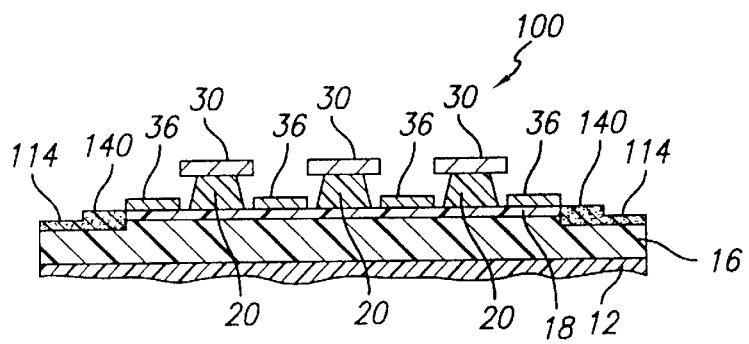
FIG. 4e

ION-IMPLANTATION AND SHALLOW ETCHING TO PRODUCE EFFECTIVE EDGE TERMINATION IN HIGH-VOLTAGE HETEROJUNCTION BIPOLAR TRANSISTORS

TECHNICAL FIELD

The present invention relates generally to GaAs heterojunction bipolar transistors, and, more particularly, to methods of fabricating edge terminations in such devices.

BACKGROUND ART

The performance of semiconductor devices, such as those that consist of layers of different conductivity type semiconductors disposed on top of each other, depends on edges of the device. Properties of the edge are typically different from the bulk of the device and as such usually produce undesirable effects. One example of such undesirable effects is edge breakdown of a reverse biased p-n junction, for example in a diode or a bipolar transistor. The local electric field at the edge of the junction can be much higher than that in the bulk of the junction and acts to degrade the maximum voltage capability of the device.

For a semiconductor such as GaAs, the edge of the termination is thought to degrade the breakdown voltage of the device significantly. It is desirable therefore to find a technique where the field at the edge can be reduced.

Some of the prior art that is improved upon is described in the following publication: F. Ren et al, "Implant isolation of GaAs—AlGaAs heterojunction bipolar transistor structures", *Applied Physics Letters*, Vol. 56, No. 9, pp. 860–862(Feb. 26, 1990).

Ren et al describe the use of ion-implantation damage for edge termination in heterojunction bipolar transistors (HBTs). Ion-implantation is widely used in MESFETs (metal-semiconductor field effect transistors) and HEMTs (high electron or hole mobility transistors) where the layers to be terminated are relatively shallow; however, ion-implantation becomes less feasible where thick layers of semiconductors are to be isolated. Also, the use of implantation alone is not sufficient for making edge termination devices where highly doped layers are present, such as the HBTs, and the device is expected to withstand high voltages.

Mesa processing is well-known in the technical literature and any text book discussion on HBTs provides sufficient information.

Presently, the edge termination is made by first masking the device and then etching-down semiconductor material around the device, resulting in a mesa structure about 2 to 3 micrometers high. The breakdown voltage in the non-passivated device can be a sensitive function of mesa-depth as well as the edge properties. As such, there is a large variation in breakdown voltage for devices fabricated across a substrate. The breakdown voltage is sensitive to contaminants and easily degrades.

Thus, there is a need to provide a method for improving the edge terminations in such devices while maintaining breakdown voltage at desirable high levels.

DISCLOSURE OF INVENTION

In accordance with the present invention, a method is provided for improving edge terminations in a semiconductor device while maintaining breakdown voltage of said semiconductor device at or near its theoretical limit. The method comprises: employing ion-implantation to create a compensated region around said semiconductor device, followed by wet chemical etching to form a mesa on the order of 0.2 to 0.3 $\mu$m.

The present invention provides a simple but novel method of fabricating edge terminations in semiconductor devices in general and in devices employing p-n junctions such as in a GaAs heterojunction bipolar transistor (HBT) to achieve near-ideal electrical characteristics at the device edge. Instead of traditional edge beveling techniques such as those involving grinding, sandblasting, or mesa-etching using masks, the technique of the present invention utilizes ion-implantation to create a compensated region around the device and wet chemical etching to make a shallow mesa.

A vertical mesa is considered to be the most effective mesa termination in these devices. Where passivation of exposed edges and planarity of the device is considered an issue, ion-implantation has been employed to achieve good device termination. In power HBTs involving collector thickness of many micrometers, either of the two approaches is not satisfactory. The present invention provides a technique that is vital to high-voltage HBTs and could in principle be applied to any HBT device to achieve effective edge termination. By "high-voltage" is meant voltage greater than 100 V, preferably 200 to 700 V, although lower voltage devices, down to 30 V, may also be beneficially improved in accordance with the teachings herein. By "effective edge termination" is meant an edge termination where the properties of the device edges do not limit the operating voltage. In an effectively terminated device, the operating voltage is determined by the properties of the "bulk" of the device.

The purpose of the present invention is to make edge terminations on high voltage HBT devices without degrading the breakdown voltage. A secondary but important purpose is to preserve the planarity of the device. The breakdown voltage of these devices is presently limited by the properties of the edge and the mesa process results in a non-planar device that is difficult to passivate.

With the technique disclosed herein, it is possible to make devices with breakdown voltages very close to the theoretical maximum. This is done without needing a deep mesa on the order of 2 to 3 $\mu$m. In the best devices measured so far, a mesa depth of 0.2 to 0.3 micrometers was sufficient to reach the maximum voltage breakdown. The breakdown voltage remains stable after subsequent processing steps. The edge of the mesa may then be encapsulated using a silicon nitride film.

The teachings of the present invention are applicable to high voltage switching transistors. This device is the enabling technology for VHF power converters, but can be used in many other types of power converters.

In general, the present invention is applicable to all semiconductor devices where edge terminations such as described here may be required.

BRIEF DESCRIPTION OF THE DRAWINGS

The patent or application file contains at least one drawing executed in color. Copies of this patent or patent application with color drawing(s) will be provided by the Office upon request and payment of the necessary fee.

FIGS. 4a–4e are side elevational views, depicting the essential steps in the method of the present invention;

FIG. 5a is a top plan view, depicting the device after the processing following the step depicted in FIG. 4b;

FIG. 5b is a top plan view, depicting the device after the processing following the step depicted in FIG. 4c;

BEST MODES FOR CARRYING OUT THE INVENTION

Figure 1:
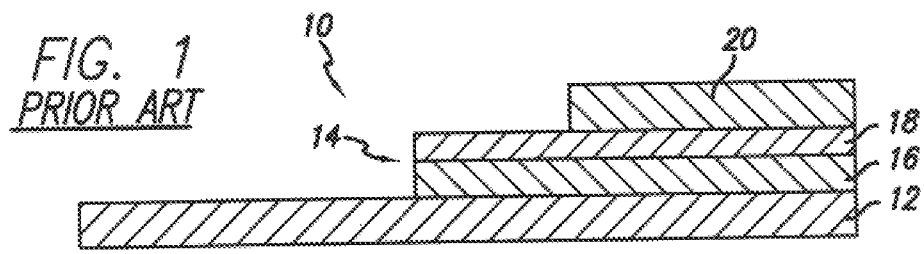
FIG. 1 is a side elevational view, schematically depicting a conventional heterojunction bipolar transistor (HBT), showing mesa isolation.
Figure 2:
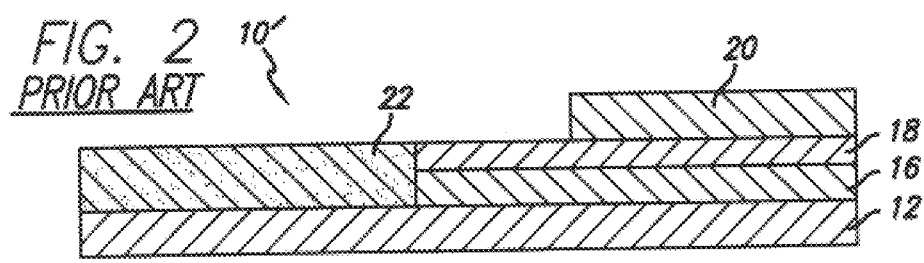
FIG. 2 is a side elevational view, similar to that of FIG. 1, schematically depicting a conventional HBT transistor, showing ion-implantation isolation.

FIGS. 1 and 2 depict prior art HBT (heterojunction bipolar transistor) strictures 10, 10' resulting from mesa isolation and ion-implantation, respectively.

In the former case, a substrate 12 has formed thereon a mesa 14 comprising a collector layer 16, formed on the substrate, and a base layer 18 formed on the collector layer. An emitter layer 20 is formed on top of the mesa. Suitable electrical connections (not shown) are made to the three layers, as is well-known.

In the latter case, the substrate 12 has formed thereon the collector layer 16 and base layer 18, as in the former case. The emitter layer 20 is formed on the base layer 18, as also in the former case. However, instead of a mesa 14, portions of the collector layer 16 and base layer 18 are subject to ion-implantation to form an ion-implanted region 22, which serves to provide the requisite isolation. Again, suitable electrical connections (not shown) are made to the three layers, as is also well-known.

Figure 3A:
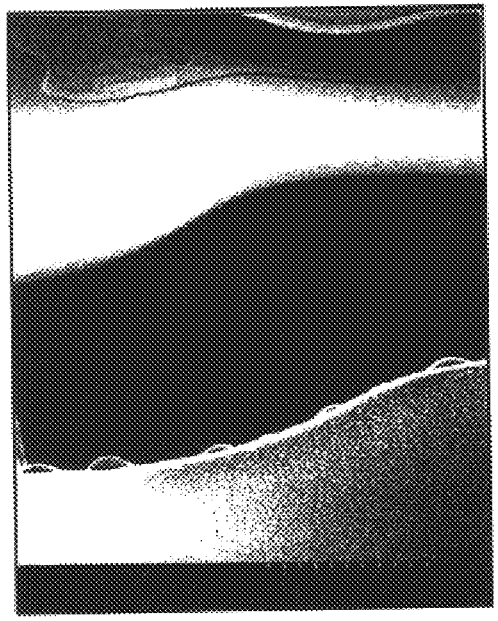
FIG. 3a is a cross-sectional scanning electron micrograph of a conventional mesa-terminated HBT.
Figure 3B:
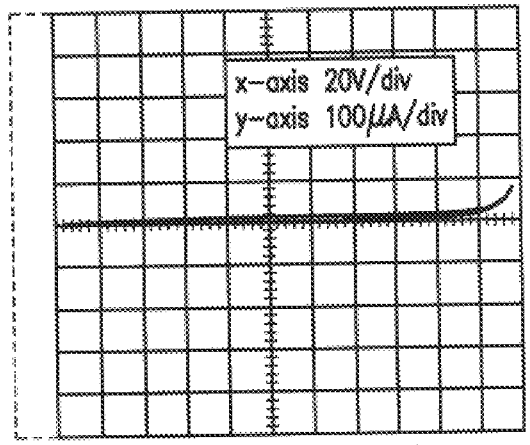
FIG. 3b is reverse current-voltage (I–V) plot of a conventional mesa-terminated HBT.

FIG. 3a shows an edge profile of the present inventors' baseline edge termination process (for which the present invention is an improvement thereover) and FIG. 3b shows the reverse breakdown characteristics that result. Breakdown voltage at 200V is only 80% of theoretical maximum in this better-than-typical device. Typically, it can be far worse. Localized high electric fields, as well as a high density of surface states at the edge, are thought to be responsible for premature breakdown at the edge.

FIGS. 4–7 show the fabrication sequence employed in the process of the present invention.

Turning first to FIGS. 4a–4b and 5a, emitter-metal stripes 30 of an HBT 100 (FIG. 4e) are patterned on a layer 20 (that is the source of the emitter layer 20) by a suitable lift-off metallization method, as shown in FIG. 4a. As in the prior art devices, collector layer 16 is formed on substrate 12, base layer 18 is formed on collector layer 16, and emitter layer 20 is formed on base layer 18, employing techniques and processes well-known in this art. N+ type emitter semiconductor layer 20 is etched away everywhere except in regions masked by the emitter metal stripes 30. The action of the etching agent undercuts the emitter semiconductor 20, thereby forming a self-aligned metal mask 34, as shown in FIG. 4b. FIG. 5a shows a plan view of the emitter-metal stripes 30 over the collector semiconductor layer 16 at this step. The metal formation and patterning step (FIG. 4a) and the semiconductor etching step (FIG. 4b) employ procedures and materials well-known in this art.

Turning now to FIGS. 4c–4e and 5b, the base metal is next deposited, using the emitter-metal stripes 30 as a mask, resulting in base-metal stripes 36 around the emitter-metal stripes, as shown in FIG. 4c.

The device area plus a narrow region all around the periphery of the device 100 is then masked with a masking layer 38, and oxygen ion-implantation, indicated by arrows 40, is performed so as to damage the base layer 18 and collector layer 16 globally except in the regions that are masked. The masking and ion-implantation are depicted in FIG. 4d. The masking step and ion-implantation step employ procedures and materials well-known in this art. While oxygen implantation is preferred, it will be appreciated by those skilled in this art that other ion-implantations may alternatively be employed. The selection of the appropriate energy for such ion-implantation is well within the skill of the practitioner in this art.

The mask 38 is next removed. Another mask (not shown) is used to protect the device 100 so that the edge of the mask is some distance into the implanted area 140. A citric acid-based etching solution is used to remove the unmasked portions of the substrate, about 0.2 $\mu$m into the collector layer 20. This forms the required mesa 114 as shown in FIG. 5d. FIG. 5b shows a plan view of the emitter-metal stripes 30 and the base-metal stripes 36 after this step. The metal formation employs procedures and materials well-known in this art.

The presence of a partially compensated region 140 in the base 18 at the edge 42 of the device 100 acts to relax the electric field at the edge and results in a breakdown voltage that is not limited by the edge and is stable after an encapsulating layer (not shown) such as silicon nitride is deposited. The high breakdown voltage is achieved with only a shallow 0.2 to 0.3 $\mu$m mesa. This compares with 1 to 3 $\mu$m mesa needed when ion-implantation is not used.

Figure 6A:
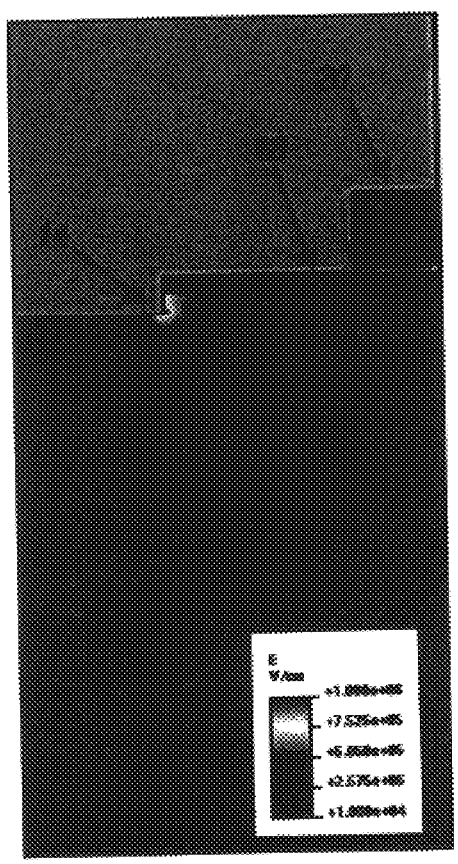
FIGS. 6a–6b depict the numerically-calculated electric field in a prior art mesa-isolated HBT (FIG. 6a) and in an HBT fabricated in accordance with the present invention (FIG. 6b)
Figure 6B:
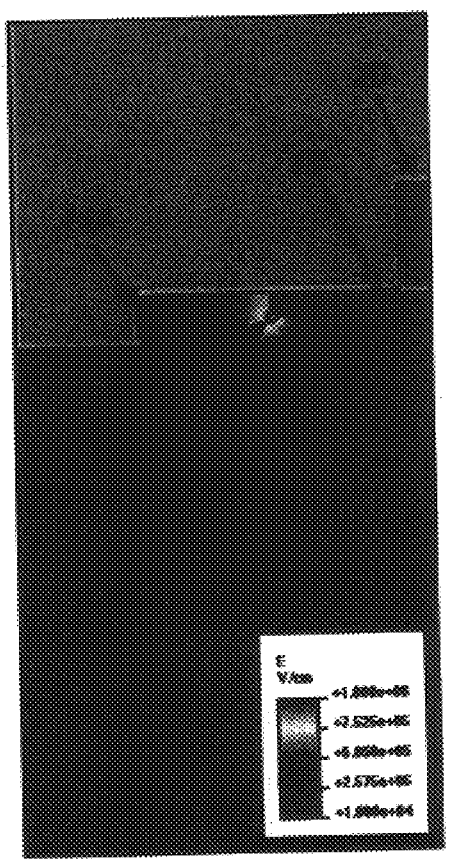

The present inventors have used numerical calculations to show that the compensated base region 140 indeed relaxes the field at the edge 42 of the device 100. FIGS. 6a–6b show the electric field at the edge of a conventional mesa (FIG. 6a) and the electric field compensated base mesa device 100 of the present invention (FIG. 6b). In the conventional-mesa device of FIG. 6a, the peak electric field, denoted by arrow 44, is seen to be located at the edge of the device 10. If the base layer 18 is partially compensated, in accordance with the present invention, then the peak electric field 44 is relocated away from the edge of the mesa. Such compensation, as discussed above, is produced by ion-implantation in a fabricated device. Thus, for the conventional mesa device, the electric field is seen to be crowded at the mesa edge and leads to premature breakdown. For the compensated base mesa of the present invention, which is similar to the ion-implanted shallow mesa in fabricated devices, the electric field is relaxed at the mesa edge.

The prior art approach relies on either:

(1) etching of collector layer down to the substrate to produce a mesa-termination as depicted in FIG. 1, or (2) using ion-implantation to render the regions beyond the edge of the device insulating as depicted in FIG. 2.

For devices employing collector layers thicker than about 2 $\mu$m, the above prior art techniques are difficult to employ and, if used, produce an unstable edge that degrades the operating voltage below the designed value. Moreover, for collectors layers thicker than 5 $\mu$m, such are needed for operating voltages of 100 V or more, prior art approach (2) may not be used due to limits on ion-implantation technology. Prior art approach (1) may be used in principle, but produces undesirable topography that makes fabrication of the device difficult. The partial compensation of the base layer, in accordance with the present invention, is seen to overcome the problems associated with the prior art approaches.

Figure 7:
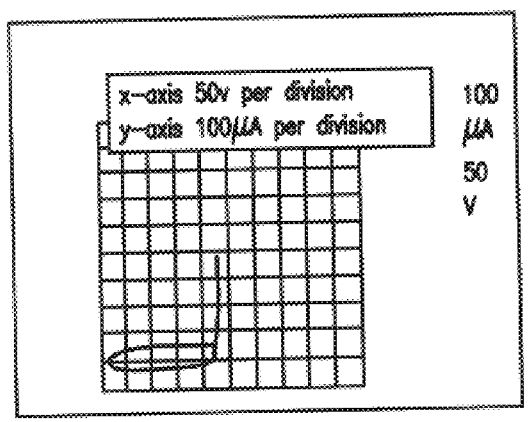
FIG. 7, on coordinates of current and voltage, depicts the breakdown voltage of a switch HBT fabricated in accordance with the present invention.
Figure 8:
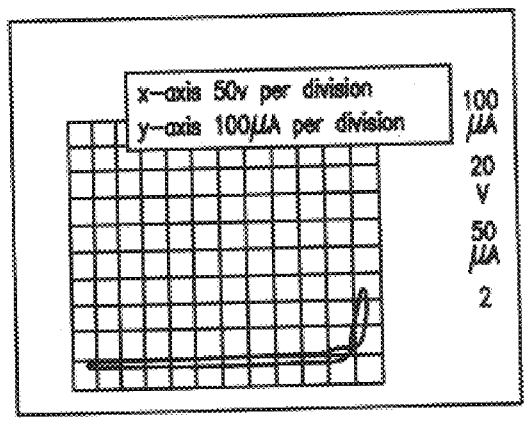
FIG. 8, on coordinates of current and voltage, depicts the breakdown voltage of a prior art mesa-isolated switch HBT.

FIG. 7 shows the reverse breakdown voltage of a GaAs HBT formed using the process of the present invention described above. The breakdown voltage is 240 V, which is almost 100% of the value expected from an infinite extent junction of same vertical semiconductor layer combination. For comparison, the reverse breakdown plot of a device made using a simple mesa (as in FIG. 1) is shown in FIG. 8.

INDUSTRIAL APPLICABILITY

The method of the present invention is expected to find use in improving the breakdown voltage of high voltage ($\geq$100 V) heterojunction bipolar transistors.

What is claimed is:

1. A method for improving edge terminations in a semiconductor device while maintaining breakdown voltage of said semiconductor device at or near its theoretical limit, said method comprising: employing ion-implantation to create a compensated region around said semiconductor device, followed by wet chemical etching to form a mesa on the order of 0.2 to 0.3 $\mu$m.

2. The method of claim 1, wherein said method comprises:
   (a) providing a substrate;
   (b) forming a collector layer on said substrate;
   (c) forming a base layer on said collector layer; and
   (d) forming an emitter layer on said base layer.

3. The method of claim 2, wherein said method further comprises:
   (e) forming emitter-metal stripes on said emitter layer;
   (f) patterning said emitter-metal stripes to form a mask;
   (g) etching away a portion of said emitter layer except in regions masked by said emitter-metal stripes, thereby forming a self-aligned metal mask;
   (h) depositing a base metal on said base layer, using said self-aligned metal mask to form base-metal stripes around said emitter-metal stripes, said base-metal strips and said emitter-metal strips defining said semiconductor device;
   (i) forming a first mask layer on said semiconductor device plus a narrow region all around the device, along its periphery, to form a masked region and to leave exposed portions between each said semiconductor device;
   (j) performing an ion-implantation of sufficient energy so as to damage said exposed portions but not said masked region to form an implanted area;
   (k) removing said mask layer;
   (l) forming a second mask layer on said semiconductor device such that said second mask extends into a portion of said implanted area; and
   (m) employing wet chemical etching to remove a portion of said base layer as well as a portion of said collector layer to form said mesa.

4. The method of claim 3 wherein said ion-implantation is performed with oxygen ions.

5. The method of claim 2 wherein said semiconductor device comprises gallium arsenide.

6. The method of claim 5 wherein said semiconductor device comprises a GaAs heterojunction bipolar transistor.

7. The method of claim 6 wherein said wet chemical etching comprises a citric acid etchant.

\* \* \* \* \*